United States Patent [19]

Haville

[11] Patent Number: 4,504,776

[45] Date of Patent: Mar. 12, 1985

[54] POWER SAVING REGULATED LIGHT EMITTING DIODE CIRCUIT

[75] Inventor: George D. Haville, Santa Barbara, Calif.

[73] Assignee: BEI Electronics, Inc., Little Rock, Ark.

[21] Appl. No.: 205,941

[22] Filed: Nov. 12, 1980

[51] Int. Cl.³ .............................................. H05B 37/02
[52] U.S. Cl. ................................................. 323/288
[58] Field of Search ................ 250/205; 323/282, 284, 323/288

[56] References Cited

U.S. PATENT DOCUMENTS

| | | | |
|---|---|---|---|
| 3,705,316 | 12/1972 | Burrous et al. | 250/205 |
| 3,872,301 | 3/1975 | Joppich | 250/205 |
| 4,001,667 | 1/1977 | Bober | 323/282 |
| 4,156,166 | 5/1979 | Shapiro et al. | 323/288 X |
| 4,160,934 | 7/1979 | Kirsch | 323/282 X |
| 4,237,405 | 12/1980 | Kellis | 323/288 X |

OTHER PUBLICATIONS

Thomas et al., "Digital Feedback Light-Emitting Diode Control", IBM TDB, Jan. 1974, vol. 16, No. 8, pp. 2598-2600, 250-205.

Primary Examiner—Peter S. Wong
Assistant Examiner—Judson H. Jones
Attorney, Agent, or Firm—Burmeister, York, Palmatier, Hamby & Jones

[57] ABSTRACT

A power saving regulated light source circuit, comprising a light emitting diode (LED), a direct current source and a switching transistor connected in series with the LED, a control voltage producing resistor connected in series with the LED to produce a control voltage corresponding to the current through the LED, a storage capacitor connected in parallel with the series combination of the LED and the resistor, a comparator having its output connected to the input of the transistor, the comparator having a reference input and a control input, a stabilized biasing source for supplying a stabilized reference voltage to the reference input, the control input of the comparator being connected to the control voltage producing resistor, the comparator having a high output state when the reference voltage exceeds the control voltage while having a low output state when the control voltage exceeds the reference voltage, the transistor being conductive in response to the high state while being nonconductive in response to the low state, the transistor when conductive being effective to charge the capacitor and to increase the control voltage, whereby the comparator is cycled between the high and low output states while the transistor is cycled between conductive and nonconductive states.

12 Claims, 3 Drawing Figures

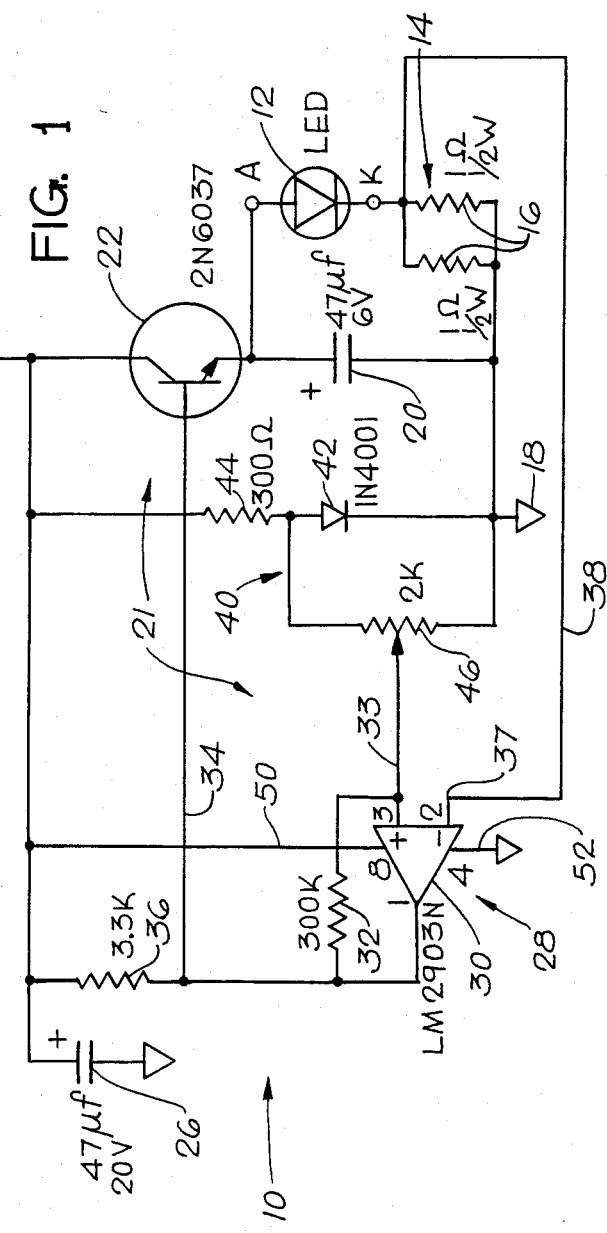
FIG. 1
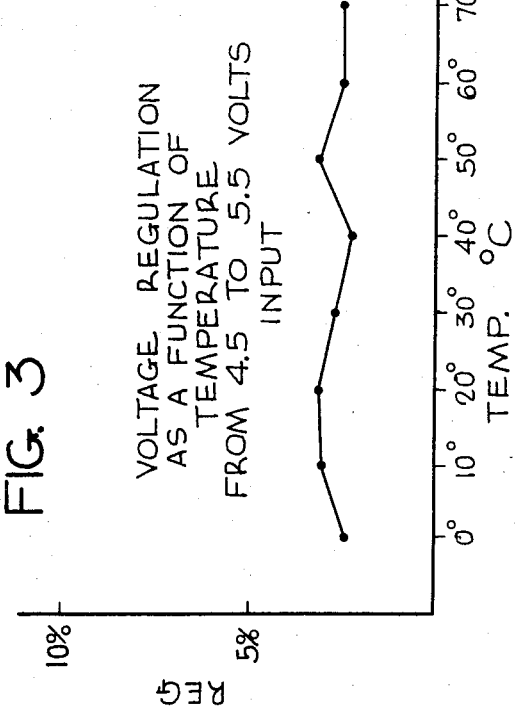
FIG. 2
FIG. 3

4,504,776

POWER SAVING REGULATED LIGHT EMITTING DIODE CIRCUIT

FIELD OF THE INVENTION

The present invention relates to a power saving regulated light emitting diode circuit, which is particularly applicable to light emitting diodes having a high light output and a high current drain, such as approximately one half ampere, for example. A light emitting diode of this type may be employed very advantageously as the light source for an optical encoder having a rotatable code disc, or some other movable code member, with a multiplicity of code tracks which are illuminated by the light source. The light is interrupted or modulated by the code tracks and then is supplied to corresponding photoelectric transducers or detectors, which produce a multiplicity of outputs, often representing a multidigit binary code word representing the position of the code disc or member. The code disc may be connected to a rotatable shaft, so that the position of the shaft will be encoded by the encoder, as a multiplicity of electrical signals, often representing a variable multidigit code word to be supplied to a computer or some other control system.

OBJECTS OF THE INVENTION

One object of the present invention is to provide a new and improved circuit for regulating or stabilizing the current through a light emitting diode, to stabilize the light output of the diode.

A further object is to provide a new and improved circuit which not only regulates the current through the diode, but also saves power, so as to reduce the power consumption of the circuit, while also reducing the heat produced by the circuit.

Another object is to provide a new and improved regulating circuit which compensates for variations in the input voltage, the operating temperature and the voltage drop across the light emitting diode.

SUMMARY OF THE INVENTION

To achieve these objects, the present invention preferably provides a power saving regulated light source, comprising a light emitting diode (LED), electronic switching means including output means and input means, a direct current source connected in series with the output means and the LED, a storage capacitor connected in parallel with the LED, control voltage producing means connected to the LED for producing a control voltage corresponding to the current through the LED, the input means of electronic switching means including a reference input and a control input, the output means of the electronic switching means having conductive and nonconductive states, the output means being in the conductive state when the voltage at the reference input exceeds the voltage at the control input, the output means being in the nonconductive state when the voltage at the control input exceeds the voltage at the reference input, reference voltage means for supplying a reference voltage to the reference input, and means for supplying the control voltage to the control input, the electronic switching means being effective when in the conductive state to charge the capacitor and to increase the control voltage until the electronic switching means is switched to the nonconductive state, the electronic switching means thereby being cycled between the conductive and nonconductive states.

The control voltage producing means may take the form of a resistor in series with the LED.

The electronic switching means may include positive feedback means for producing a triggering action between the conductive and nonconductive states.

The output means of the electronic switching means may comprise a switching transistor, while the input may comprise a comparator having its output connected to the input of the transistor. The comparator preferably includes a noninverting input serving as the reference input, and an inverting input serving as the control input. A feedback path may be connected between the output and the noninverting input of the comparator to produce a triggering action between the conductive and nonconductive states.

The reference voltage means may comprise a stabilizing diode and a resistor connected in series to the direct current source, and a potentiometer connected between the stabilizing diode and the reference input for adjusting the reference voltage supplied to the reference input.

The comparator may be cycled between a high state, which switches the transistor to its conductive state, and a low state, which switches the transistor to its nonconductive state.

An additional storage capacitor may be connected across the series combination of the transistor, the light emitting diode and the control voltage producing resistor. The stabilizing diode may be either a conventional diode or a Zener diode.

BRIEF DESCRIPTION OF THE DRAWINGS

Further objects, advantages and features of the present invention will appear from the following description, taken with the drawings, in which:

FIG. 1 is a schematic circuit diagram of a power saving regulated light emitting diode circuit to be described as an illustrative embodiment of the present invention.

FIG. 2 is a graph illustrating the general waveform of the LED current in the circuit of FIG. 1.

FIG. 3 is a graph illustrating the voltage regulation of the circuit, as a function of temperature, for variations in the input voltage from 4.5 to 5.5 volts.

DETAILED DESCRIPTION OF THE EMBODIMENT

As just indicated, FIG. 1 illustrates a power saving circuit 10 for supplying a regulated or stabilized energizing current to a light emitting diode (LED) 12, which may be of a type having a high light output and a high current requirement, such as approximately ½ ampere, for example. The LED 12 may be adapted to serve as the light source for an optical encoder. In such service, the LED 12 will provide all of the light needed to illuminate a multiplicity of optical code tracks on a rotatable code disc or some other movable code member. For such an application, it is highly desirable to stabilize the current through the LED 12, so as to stabilize the light output of the LED. The circuit 10 of FIG. 1 provides a highly stable, well regulated current through the LED 12, despite variations in the power supply voltage and the operating temperature. Moreover, the circuit 10 is adapted to compensate for individual variations in the voltage drop characteristics of various light emitting diodes which may be employed in the circuit.

In the circuit 10 of FIG. 1, the LED 12 is provided with control voltage producing means 14, to produce a control voltage corresponding to the current through the LED. Such means 14 may comprise one or more resistors, through which the LED current will flow. As shown in FIG. 1, two resistors 16 are connected in parallel with each other, and the parallel combination is connected in series with the LED 12. Two one ohm resistors are employed in this instance to provide the desired value of one-half ohm. A single resistor would suffice, but the desired value of one-half ohm is not readily available commercially. One side of each of the resistors 16 is connected to ground 18, so that a control voltage appears between the ungrounded side of each resistor 16 and ground.

A storage capacitor 20 is effectively connected in parallel with the LED 12, the capacitor 20 being in parallel with the series combination of the LED 12 and the parallel connected resistors 16.

Pulses of current are supplied to the parallel combination of the LED 12 and the storage capacitor 20 by electronic switching means 21, illustrated as including a transistor 22, serving as the output means of the electronic switching means 21. The transistor 22 is connected in series with a direct current source, illustrated schematically in FIG. 1 as a +15 volt terminal 24, the negative terminal of the direct current source being connected to ground. The voltage of the direct current source may vary widely, as, for example, from approximately 4.3 volts to 16 volts or even higher, depending upon the voltage rating of the various components. A second storage capacitor 26 is preferably connected between the +15 volt terminal 24 and ground.

The electronic switching means 21 may also include an input circuit or means 28, illustrated as comprising a comparator 30, which may be in the form of a commercially available integrated circuit, having its output connected or coupled to the input of the transistor 22.

It is preferred to provide the electronic switching means with positive feedback means, illustrated as comprising a feedback resistor 32 forming a feedback path between the output and the noninverting input 33 of the comparator 30. The positive feedback produces or enhances a triggering action in the electronic switching means 21.

As shown in FIG. 1, the output of the comparator 30 is connected directly to the base of the transistor 22 by a lead 34. A load resistor 36 is connected between the +15 volt terminal 24 and the output of the comparator 30. The resistor 36 also establishes a biasing voltage on the base of the transistor 22. The inverting input 37 of the comparator 30 serves as a control input, to receive the control voltage from the control voltage producing means 14, in circuit with the LED 12. As shown, the control voltage is supplied to the inverting input 37 by a lead 38, connected between the inverting input 37 and the ungrounded side of the parallel connected resistors 16.

The noninverting input 33 of the comparator 30 serves as a reference input, to which a reference voltage is supplied by stabilized biasing means 40, illustrated as comprising a stabilizing diode 42 and a current limiting resistor 44, connected in a series circuit between the +15 volt power supply terminal 24 and ground. The current through the series circuit produces a stabilized voltage across the diode 42 between the ungrounded side of the diode and ground. The diode 42 may be an ordinary solid state diode, or may also be a Zener diode. An ordinary diode is less expensive and affords satisfactory stabilization, while a Zener diode affords better stabilization, but at a higher cost. A potentiometer 46 is connected between the diode 42 and the noninverting input 33 of the comparator 30, to supply at least a portion of the stabilized diode voltage to the noninverting input 33, to serve as a reference voltage. The potentiometer 46 makes it possible to adjust the reference voltage, supplied to the noninverting input 33 of the comparator 30. In many cases, satisfactory results can be achieved by replacing the comparator with an operational amplifier or a Schmitt trigger circuit.

OPERATION OF THE EMBODIMENT

In the operation of the regulated LED circuit 10 of FIG. 1, the current through the LED 12 is regulated by cycling the electronic switching means 21 between conductive and nonconductive states, as required to establish and maintain the desired LED current. The transistor 22, functioning as the output device of the electronic switching circuit 21, is cycled between conductive and nonconductive states. The comparator 30, functioning as the input device of the electronic switching circuit 21, is cycled between high and low output states. The comparator 30 responds to the relative polarity of its two inputs 33 and 37. When the voltage at the reference input 33 exceeds the voltage at the control input 37, the output of the comparator 30 goes to its high state. When the voltage at the control input 37 exceeds the voltage at the reference input 33, the output of the comparator 30 goes to its low state. In the low output state of the comparator 30, the transistor 22 is nonconductive. In the high output state of the comparator 30, the transistor 22 is conductive to saturation.

When the power supply voltage is initially applied to the +15 volt terminal 24, the filtering or storage capacitor 26 is charged to the full power supply voltage. Operating power is supplied to the comparator 30 by positive and negative power supply leads 50 and 52. The reference voltage is supplied immediately to the noninverting or reference input 33, because there is no capacitor in the stabilized biasing circuit 40, comprising the stabilizing diode 42, the voltage dropping resistor 44, and the potentiometer 46. Initially, the control voltage at the inverting or control input 37 is zero, and this control voltage increases at a slow rate, because of the necessity of charging the storage capacitor 20 through the transistor 22, in order for the control voltage to increase. Thus, the output of the comparator 30 goes to a high state, because of the quick establishment of the reference voltage at the reference input 33, so that the reference voltage exceeds the control voltage, which rises at a slow rate. The switching of the comparator 30 to its high state causes the base voltage of the transistor 22 to go high, so that the transistor is switched to a state of saturated conductivity. The storage capacitor 20 is charged through the conductive transistor 22 from the power supply 24. As the capacitor 20 is charged, the current through the LED 12 and the resistors 16 increases. The LED current produces a voltage drop across the resistors 16 to serve as the control voltage. When such control voltage rises sufficiently to exceed the stabilized reference voltage at the reference input 33, the output of the comparator 30 is switched or triggered to a low state, so that the voltage at the output of the comparator 30 drops to a low value, near ground potential. This low output voltage is applied directly to the base of the transistor 22 and causes the transistor 22 to become nonconductive because the base voltage is substantially less than the emitter voltage.

With the transistor 22 nonconductive, the capacitor 20 is no longer charged through the transistor. Instead, the capacitor 20 discharges through the LED 12 and the resistors 16, so that the LED current decreases gradually. The corresponding control voltage across the resistors 16 also decreases gradually. When the control voltage at the control input 37 drops below the reference voltage at the reference input 33, the output of the comparator 30 again switches to the high state, so that the output voltage from the comparator 30 increases to a value which is substantially greater than the emitter voltage of the transistor 22. Accordingly, the transistor 22 is switched to a saturated conductive state.

The capacitor 20 is again charged through the transistor 22 from the power supply 24. Thus, the transistor 22, constituting the output device of the electronic switching circuit 21, is cycled between conductive and nonconductive states, to supply pulses of current to the storage capacitor 20 and the LED 12. The comparator 30, constituting the input device of the electronic switching circuit 21, is cycled between its high and low output states to control the conductivity of the transistor 22.

The comparator 30 has a triggering action which is enhanced by the positive feedback provided by the feedback resistor 32. When the output of the comparator 30 goes to its high state, due to the decrease of the control voltage at the control input 37 below the reference voltage at the reference input 33, thefeedback resistor 32 has the effect of increasing the reference voltage slightly, so that the control voltage must increase to a correspondingly greater extent, before the comparator 30 will be switched back to its low state. In such low state, the feedback is no longer present, so that the reference voltage drops to a slight extent to its normal value, below which the control voltage must drop before the comparator 30 will be switched to its high state. Thus, the positive feedback afforded by the resistor 32 causes the reference voltage at the reference input 33 to cycle up and down to a slight but appreciable extent, as the comparator 30 is cycled between its high and low states. The switch-on value of the control voltage at the input 37 is thus slightly higher than the switch-off value, to produce a hysteresis effect, which stabilizes both the high and low output states of the comparator 30, so that there is an enhanced and more definite triggering action between the high and low states. An ordinary operational amplifier may be employed instead of the comparator, if desired. A Schmitt trigger circuit may also be employed.

The regulated LED circuit of FIG. 1 maintains and regulates the control voltage across the resistors 16 at a value corresponding closely to the reference voltage supplied by the potentiometer 46. The control voltage is cycled up and down to a slight extent due to the cycling of the transistor 22 between its conductive and nonconductive states.

The current through the LED 12 is proportional to the control voltage across the resistor 16, so that the LED current is also closely maintained and stabilized. For example, it may be desired to stabilize the current through the LED 12 at one half ampere (500 milliamperes). At this current value, the control voltage across the two parallel connected one ohm resistors 16 is one quarter volt (250 millivolts), which is the IR voltage drop caused by the flow of one half ampere through a resistance of one half ohm. To achieve these regulated values of the LED current and the control voltage, the potentiometer 46 is adjusted to provide a reference voltage of substantially 250 millivolts. It will be understood that the regulated LED current can be increased or decreased by adjusting the potentiometer 46 to increase or decrease the reference voltage.

Due to the cycling or switching of the transistor 22 between its conductive and nonconductive states, the transistor 22 carries pulses of current. Such pulses are of short duration.

The second storage capacitor 26 acts as a filter and maintains a substantially steady or smooth direct voltage between the +15 volt power source terminal 24 and ground.

The control voltage producing resistors 16 provide a small value of resistance, only one half ohm, for example, in series with the LED 12. Consequently, the voltage drop across this resistance is small compared to the voltage across the LED 12. Thus, the circuit basically measures and controls the current through the LED 12. It has been found that the regulating circuit 10 is capable of stabilizing the current through the LED 12 over an extremely wide range of input voltage from the direct current power source 24. Thus, in one set of tests, the LED current was stabilized at approximately 500 milliamperes for an input voltage ranging from approximately 4.3 volts to approximately 16 volts.

The current through the LED 12 is closely regulated and maintained virtually constant, despite variations in the operating temperature, as well as variations in the voltage of the direct current source 24. In this regard, the performance of the regulating circuit 10 is illustrated in the graph of FIG. 3, in which the voltage regulation of the circuit is plotted as a function of temperature. In the tests represented by FIG. 3, the voltage regulation remained in a range from about 2 to about 3 percent throughout a temperature range from 0° to 70° C. For these tests, the nominal voltage of the direct current source was 5 volts. The voltage was varied from 4.5 to 5.5 volts, which is a variation of ±10%. The percentage regulation of the LED current was determined for this range of voltage variation.

The regulating circuit 10 of FIG. 1 has the further advantage of making it possible to use a wide variety of individual light emitting diodes, despite wide variations in the operating characteristics of the individual diodes. It has been found that individual light emitting diodes have widely different voltage drop characteristics. Thus, for an operating current of 500 milliamperes, it has been found that the voltage drop across various individual light emitting diodes may vary from about 1.1 volts to about 2 volts. The regulating circuit 10 is capable of accommodating such a wide range in the voltage drop characteristics of the LED 12. It is not necessary to provide a special selection of parts values to accommodate the wide ranging characteristics of the light emitting diodes.

The regulating circuit 10 of FIG. 1 has the additional advantage of affording a significant saving in operating power consumption. The regulating circuit 10 is capable of operating the LED 12 at a current of 500 milliamperes, with an input current of only approximately 300 milliamperes at a direct current power supply voltage of .5 volts, for example. For this case, the power consumption of the circuit 10 is only about 1.5 watts, which is the product of 5 volts and 0.3 ampere. If the 500 milliampere current for the LED 12 were drawn directly from the 5 volt source through a voltage dropping resistor, the power consumption would be 2.5 watts, representing the product of 5 volts and 0.5 ampere. Thus, for this example, the regulating circuit 10 reduces the power consumption from 2.5 watts to 1.5 watts, representing a saving of 1 watt, or 40%. This reduction in power consumption has the advantage of reducing the power drain on the direct current source, while also reducing the amount of heat generated in the energizing circuit for the LED.

The reduction in the power consumption results from the pulsing or cycling of the switching transistor 22 and the provision of the storage capacitor 20 in parallel with the LED 12. The pulsing of the transistor 22 is essentially a switching operation, so that very little heat is dissipated in the transistor.

The power saving becomes more dramatic with increasing direct current supply voltage. For example, in one set of tests, it was found that the current drain of the regulating circuit dropped from approximately 300 milliamperes, with an input voltage of 5 volts, to approximately 150 milliamperes, with an input voltage of about 10 volts, so that the power consumption remained at about 1.5 watts. At the same time, the LED current was stabilized at approximately 500 milliamperes. For a conventional circuit with a voltage dropping resistor in series with the LED, the power consumption at 10 volts would be 5 watts, representing the product of 10 v and 0.5 amp. Thus, the regulating circuit of FIG. 1 achieves a reduction in power consumption from approximately 5 watts to approximately 1.5 watts with a source voltage of 10 volts. This reduction in power consumption is approximately 3.5 watts, amounting to about 70%.

For a higher supply voltage, such as 15 volts, the saving in power is even greater. Because of the pulsing of the transistor 22, the power input to the transistor circuit is relatively constant regardless of the power supply voltage. The reference voltage supply circuit takes more power at higher voltages, but such power is small compared to the overall power. As a result, the percentage saving of power becomes greater with increasing supply voltage, when compared with a conventional circuit using a voltage dropping resistor in series with the LED.

FIG. 2 is a graph illustrating the general waveform of the current through the LED 12 in the circuit of FIG. 1. Each time division in FIG. 2 represents 1 microsecond. The waveform represents the alternate charging and partial discharging of the storage capacitor 20. The resulting pulses may have a fairly high frequency, such as 650 kilohertz, for example, but the frequency can be varied widely, depending upon the values and parameters of the circuit, particularly the value of the storage capacitor 20, the effective resistance of the LED 12, the effective resistance of the transistor 22, and the direct current supply voltage. The present invention is not to be limited to any particular frequency or operating parameters.

Various workable parts values and type designations are given in FIG. 1. However, those skilled in the art will be able to assign other satisfactory parts values and type designations. The present invention is not to be limited to any particular values or type designations. Moreover, other modifications, alternative constructions and equivalents may be employed, without departing from the true spirit and scope of the present invention.

I claim:
1. A power saving regulated light source circuit, comprising
   a light emitting diode,
   a direct current source and a switching transistor connected in series with said light emitting diode,
   a control voltage producing resistor connected in series with said light emitting diode to produce a control voltage corresponding to the current through said light emitting diode,
   a storage capacitor connected directly to said switching transistor and in parallel with the series combination of said light emitting diode and said resistor,
   a switching comparator having its output connected directly to the input of said transistor,
   said switching comparator having a reference input and a control input,
   stabilized biasing means for supplying a stabilized biasing voltage to said reference input,
   and means directly connecting said control input of said switching comparator to said control voltage producing resistor,
   said switching comparator affording a triggering action between a first output state when the voltage at said reference input exceeds the voltage at said control input and a second output state when the voltage at said control input exceeds the voltage at said reference input,
   said transistor being conductive in response to said first output state and being nonconductive in response to said second output state,
   said transistor when conductive being effective to directly charge said capacitor and to increase said control voltage until said switching comparator is triggered to said second output state,
   said switching comparator being triggered to said first output state when said control voltage becomes less than said reference voltage due to the discharging of said capacitor through said light emitting diode,
   whereby said switching comparator is cycled repeatedly between said first and second output states and said transistor is cycled repeatedly between conductive and nonconductive states.
2. A circuit according to claim 1,
   including a feedback resistor connected between the output of said comparator and said reference input for producing positive feedback to impart enhanced stability to said first and second output states.
3. A circuit according to claim 1,
   in which said first output state of said comparator constitutes a high state while said second output state constitutes a low state,
   said control input of said comparator constituting an inverting input while said reference input constitutes a noninverting input.
4. A circuit according to claim 3,
   including a feedback resistor connected between the output of said comparator and said reference input for producing positive feedback to impart enhanced stability to said first and second output states.
5. A circuit according to claim 1, including
   an additional storage capacitor connected across the series combination of said transistor, said light emitting diode and said control voltage producing resistor.

6. A power saving regulated light source circuit, comprising a light emitting device,
   electronic switching means including output means,
   a direct current source connected in series with said output means and said light emitting device,
   a storage capacitor connected directly to said output means and in parallel with said light emitting device,
   control voltage producing means connected to said light emitting device for producing a control voltage corresponding to the current supplied to said light emitting device,
   said electronic switching means including a reference input and a control input,
   said electronic switching means including trigger means affording a triggering action between conductive and nonconductive states of said output means,
   said output means being triggered to said conductive state when the voltage at said reference input exceeds the voltage at said control input,
   said output means being triggered to said nonconductive state when the voltage at said control input exceeds the voltage at said reference input,
   reference voltage means for supplying a steady reference voltage to said reference input,
   and means for supplying said control voltage directly to said control input,
   said electronic switching means being effective when in said conductive state to directly charge said capacitor and to increase said control voltage until it exceeds said reference voltage whereupon said electronic switching means is triggered to said nonconductive state,
   said electronic switching means being triggered to said conductive state when said control voltage is reduced below said reference voltage due to the discharge of said capacitor through said light emitting device,
   said electronic switching means thereby being cycled repeatedly between said conductive and nonconductive states.

7. A circuit according to claim 6,
   said control voltage producing means taking the form of a resistor in series with said light emitting device.

8. A circuit acording to claim 6,
   said electronic switching means including positive feedback means for producing an enhanced triggering action between said conductive and nonconductive states.

9. A circuit according to claim 6,
   said output means of said electronic switching means comprising a switching transisitor,
   said trigger means comprising a switching comparator having its output connected to the input of said transistor,
   said switching comparator affording said reference input and said control input.

10. A circuit according to claim 9,
    said comparator including a noninverting input which provides said reference input and an inverting input which provides said control input.

11. A circuit according to claim 10,
    including a positive feedback path connected between the output and the noninverting input of said comparator to produce an enhanced triggering action between said conductive and nonconductive states.

12. A circuit according to claim 10,
    comprising a positive feedback path including a feedback resistor connected between the output and the noninverting input of said comparator to produce an enhanced triggering action between said conductive and nonconductive states.

* * * * *